United States Patent
Chang et al.

[11] Patent Number: 6,127,738
[45] Date of Patent: Oct. 3, 2000

[54] DETECTING REGISTRATION MARKS WITH LOW ENERGY ELECTRON BEAM

[76] Inventors: Tai-Hon Philip Chang, 1105 Nimitz La., Foster City, Calif. 94404; Hoseob Kim, 64 Berylwood La., Milpitas, Calif. 95035

[21] Appl. No.: 09/422,921

[22] Filed: Oct. 21, 1999

Related U.S. Application Data

[62] Division of application No. 09/060,496, Apr. 15, 1998.

[51] Int. Cl.[7] .......................... H01L 23/544; G01B 11/02
[52] U.S. Cl. ............................................. 257/797; 356/396
[58] Field of Search ............................ 257/797; 438/401, 438/462, 978; 356/396

[56] References Cited

U.S. PATENT DOCUMENTS

| | | | |
|---|---|---|---|
| 4,356,223 | 10/1982 | Ida et al. | 428/156 |
| 4,923,301 | 5/1990 | White | 356/356 |
| 4,992,394 | 2/1991 | Kostelak, Jr. et al. | 437/229 |
| 5,020,006 | 5/1991 | Sporon-Fiedler | 364/550 |
| 5,552,611 | 9/1996 | Enichen | 250/491.1 |
| 5,933,743 | 8/1999 | New et al. | 438/401 |

FOREIGN PATENT DOCUMENTS

| | | | |
|---|---|---|---|
| 0 342 316 | 11/1989 | European Pat. Off. | H01J 37/304 |
| 4-133349 | 5/1992 | Japan | 257/797 |

OTHER PUBLICATIONS

R.C. Farrow, et al., "Marks for Alignment and Registration in Projection Electron Lithography", J. Vac. Sci. Technolo. B 11(6), Nov./Dec. 1993, 1993 American Vacuum Society, pp. 2175–2178.

"Registration of Electron Beam During Electron Beam Pattern Exposure" IBM Technical Disclosure Bulletin, vol.32, No. 6A, Nov. 1, 1989, pp. 445/446 XP000043275.

"Noise-Reduced Registration in Corpuscular Beam Lithography" IBM Technical Disclosure Bulletin, vol. 33, No. 2, Jul. 1, 1990, p. 373 XP000123653.

*Primary Examiner*—David Hardy
*Assistant Examiner*—Jhihan B Clark
*Attorney, Agent, or Firm*—Skjerven, Morrill, MacPherson, Franklin & Friel

[57] ABSTRACT

For electron beam wafer or mask processing, a registration mark is capacitively coupled to the top surface of an overlying resist layer on a substrate to form a voltage potential on the surface of the resist layer directly over the registration mark. The registration mark is directly connected to an electrical lead that produces an AC voltage on the registration mark, which is capacitively induced on the surface of the resist layer. Alternatively, the registration mark itself is capacitively coupled to a conductive plate placed on the bottom surface of the semiconductor substrate. An AC voltage is then applied to the conductive plate that induces a charge on the registration mark, which then capacitively induces a charge on the surface of the layer of resist. An electron beam scanning across the surface of the resist layer generates secondary electrons. The secondary electrons have a low energy and are affected by the voltage potential created at the surface of the resist layer. Thus, by detecting the secondary electron signal generated by the electron beam the voltage potential on the surface of the resist layer is detected in contrast with surrounding areas. Consequently, the registration mark is detected by an electron beam, such as a low energy electron beam produced for example by an electron beam microcolumn, that does not have sufficient energy to penetrate the resist layer.

6 Claims, 1 Drawing Sheet

DETECTING REGISTRATION MARKS WITH LOW ENERGY ELECTRON BEAM

This application is a divisional of Ser. No. 09/060,496 filed Apr. 15, 1998.

FIELD OF THE INVENTION

The present invention relates to semiconductor processing and to registration marks and in particular to detecting registration marks for low energy electron beam lithography.

BACKGROUND

The use of registration or fiducial marks in semiconductor processing is well known. Registration marks are used to align one pattern layer of metal, insulator, or semiconductor material on a substrate with another pattern layer to ensure that features of the successive layers bear the correct spatial relationship to one another. The features of the registration marks are typically used to align the substrate with the lithographic writing tool being used, such as optical or direct electron beam writing lithography. During the lithography process, the registration mark is observed and used to properly align the lithographic pattern with the underlying layer. In optical lithography the registration mark is typically observed with an optical scanner. Although this method may be used with direct electron beam writing lithography as well, where the registration mark is under a layer of resist, the registration mark is conventionally "observed" by detecting the back scattered electron signal generated when the electron beam contacts the registration mark.

A conventional electron beam used in direct writing lithography typically has a high energy level, in excess of 10 keV and up to 50–100 keV. A high energy electron beam can penetrate a layer of resist with a thickness of approximately 2000 Å to 2 $\mu$m and contact an underlying registration mark. As the electron beam penetrates the resist layer, back scattered electrons are produced. By detecting the contrast in the back scattered electron signal caused when the electron beam contacts the registration mark under the layer of resist, the location of the registration mark may be determined. The electron beam is then aligned accordingly.

FIG. 1 is a side view of a semiconductor substrate 10 with a conventional registration mark 12 covered by a layer of resist 14. A conventional high energy electron beam 16 is shown penetrating resist 14 and contacting registration mark 12. Back scattered electrons, which are illustrated as arrows 18, are detected by electron detector 20. As electron beam 16 is scanned across resist layer 14, as illustrated by arrow 22, the contrast in the back scattered electron beam signal detected by detector 20 will indicate the location of registration mark 12. A conventional registration mark is typically a conductor of a material different from the substrate or a physical step or void in the substrate.

Thus, to detect underlying registration marks, conventional electron beams must operate at an energy level that is sufficient to penetrate the layer of resist. Where an electron beam does not have sufficient energy to penetrate the layer of resist to contact the registration mark there will be no contrast in the back scattered electrons to indicate the location of the registration mark.

An example of a electron beam that may not have sufficient energy to penetrate a layer of resist is a miniature electron-beam microcolumn ("microcolumn"). Microcolumns produce low energy electron beams, currently 1–2 keV, and thus may have difficulty detecting registration marks underlying the layer of resist that is greater than approximately 1000 Å. Microcolumns are based on microfabricated electron "optical" components and field emission sources and may be used for direct writing lithography. Microcolumns are discussed in general in the publication "Electron-Beam Microcolumns for Lithography and Related Applications," by T. H. P. Chang et al., Journal of Vacuum Science Technology Bulletin 14(6), pp. 3774–81, November/December 1996, which is incorporated herein by reference.

Thus, to detect a conventional registration mark, the electron beams must operate at an energy level that is sufficient to penetrate the layer of resist. Where the resist layer has a thickness greater than the penetration depth of the electron beam, one method to permit the electron beam to contact the registration mark and generate a contrasting back scattered electron signal is to remove the resist in the area directly over the registration mark. However, this extra processing step is undesirable because it is complex and time consuming.

SUMMARY

A registration mark that is under a layer of resist thicker than the penetration depth of the viewing electron (charged particle) beam may be detectable by applying an AC voltage to the registration mark to capacitively induce a voltage potential on the surface of the layer of resist. The registration mark is directly connected to an electrical lead that applies an AC voltage across the registration mark. A corresponding voltage potential is thereby capacitively induced on the surface of the layer of resist. An electron beam scanning across the surface of the layer of resist generates low energy secondary electrons that are affected by the voltage potential on the surface of the layer of resist. By detecting the contrast in the secondary electron signal as the electron beam is scanned across the surface of the layer of resist, the location of the registration mark may be precisely determined. Consequently, an electron beam with insufficient penetration depth to contact the registration mark, such as a low energy electron beam generated by an electron beam microcolumn, may be used to detect the registration mark.

The registration mark may also be capacitively coupled with a conductive plate on the bottom surface of the semiconductor substrate. By applying an AC voltage to the conductive plate, a charge is formed on the registration mark, which then capacitively induces a charge on the surface of the layer of resist directly over the registration mark. Thus, a registration mark under a layer of resist may be detected by the secondary electron signal from an electron beam, where the registration mark has no electrical connections.

BRIEF DESCRIPTION OF DRAWINGS

The above and other features, aspects, and advantages of the present invention will become better understood with regard to the following description, appended claims, and accompanying figures, where:

DETAILED DESCRIPTION

A registration mark may be capacitively coupled with the surface of an overlying resist layer by applying an AC voltage to the registration mark. The surface of the resist layer will have a voltage potential directly above the registration mark that is in contrast with the surrounding area. By detecting changes in the voltage potential with secondary electron signals, an electron beam (or other charged particle) may be used to precisely locate a registration mark beneath the resist layer without penetrating the resist layer.

Figure 1:
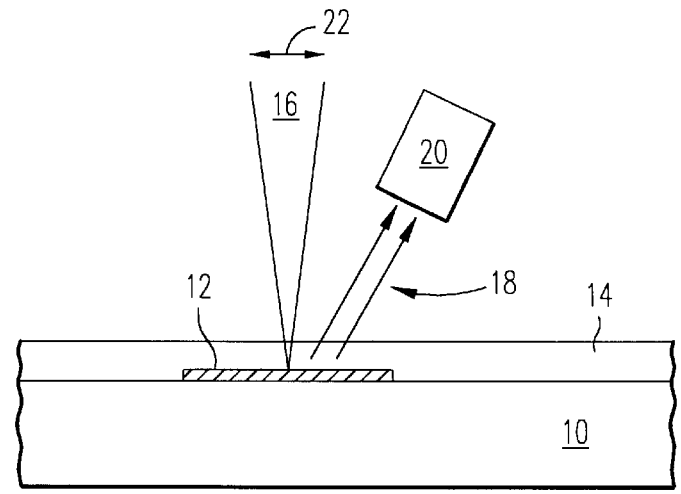
FIG. 1 is a side view of a semiconductor substrate with a conventional registration mark covered by a layer of resist, where an electron beam penetrates the layer of resist to detect the registration mark using back scattered electrons.
Figure 2:
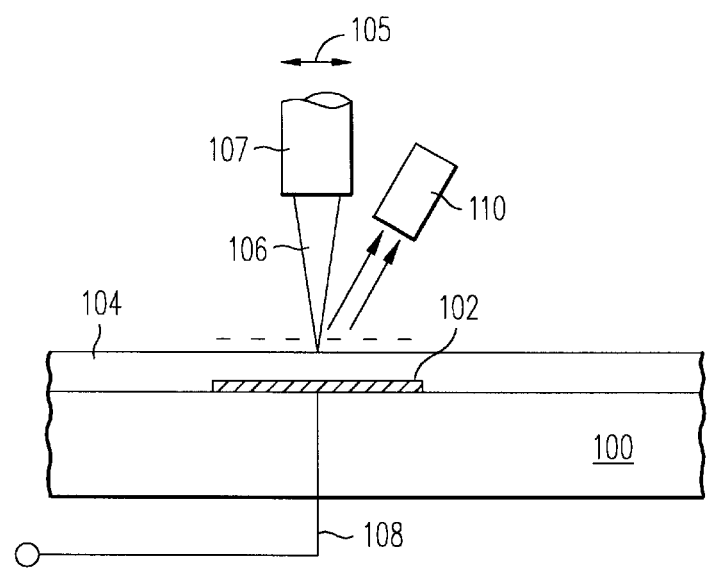
FIG. 2 is a side view of a semiconductor substrate with a registration mark that is capacitively inducing a voltage potential on the surface of the layer of resist, where an electron beam is detecting the registration mark using secondary electrons.

FIG. 2 shows a side view of a semiconductor substrate 100 with registration mark 102 under a resist layer 104, when registration mark 102 may be detected from the secondary electron signals generated by an electron beam 106 without the need to penetrate resist layer 104. Electron beam 106, which may be a low energy electron beam, is generated by an electron beam source 107, such as an electron beam microcolumn. Electron beam 106 is scanned over the surface of resist layer 104, as indicated by arrow 105. Detector 110 is sensitive to changes in the secondary electron signals that are caused by a potential voltage contrast on the surface of resist layer 104. Although the present disclosure refers to use of low energy electron beams to detect registration mark 102, it should be understood that the present invention may be used by any viewing electron beam that does not have sufficient energy to penetrate the thickness of resist layer 104.

Registration mark 102 is a conductive metal such as aluminum or platinum that is sputter deposited as a layer. The layer of aluminum or platinum is then conventionally etched to form the desired registration mark 102. Of course, other conductive metals may be used, and the particular method used to deposit registration mark 102 may depend for example on the type of metal used for registration mark 102 and at what point in the semiconductor processing the registration mark 102 is being deposited. It should be understood that registration mark 102 may be deposited on top of layers formed over the surface of substrate 100, and not only on the surface of substrate 100 itself. Moreover, it should be understood that multiple registration marks may be applied simultaneously.

An electrical lead 108 of conductive metal formed on the substrate surface is directly connected to registration mark 102 and is relayed to the edge of substrate 100 such that a voltage can be applied to lead 108. Electrical lead 108 may be formed simultaneously with registration mark 102 through the same process of deposition and etching or any other appropriate manner. Electrical lead 108 may thus be made out of the same conductive metal as registration mark 102. Although electrical lead 108 is shown off the surface of substrate 100 in FIG. 2, this is for the sake of clarity. It should be understood that electrical lead 108 is actually deposited along the surface of substrate 100 or on top of a layer formed over the principal surface of substrate 100.

Resist layer 110 is then conventionally applied over registration mark 102 and electrical lead 108, through deposition or spinning or other appropriate manner. Although resist layer 110 is shown as only one layer, it should be understood that resist layer 110 may be a number of resist layers and/or intermediate layers, such as insulator or semiconductor material, necessary for the processing of substrate 100.

By applying an AC voltage to registration mark 102 via electrical lead 108, a capacitive charge is generated at the surface of resist layer 104 directly over registration mark 102, as shown in FIG. 2 as a series of "−" signs. Thus, detection of the voltage potential at the surface of resist layer 104 will indicate the location of registration mark 102. An AC voltage of approximately 1–2 volts having an AC frequency between 2 and 2k Hz may be used to generate an adequate voltage potential at the surface of resist layer 104.

An electron beam incident on the surface of resist layer 104 generates two signals. A back scattered electron signal is generated as the electron beam penetrates a resist layer and typically has the same energy as the electron beam that generated the back scattered electron signal. A low energy secondary electron signal is also generated. The secondary electron signal is generated when the electron beam contacts the surface of the resist layer and the secondary electron signal has an energy level that is much lower than the incident electron beam that generated it. For example, where a 1 keV electron beam generated by an electron beam microcolumn is used, the secondary electron signal will have an energy level of approximately 1–2 eV.

The trajectories of the secondary electrons will be influenced by the voltage potential at the surface of resist layer 104. Thus, by detecting the secondary electrons generated by electron beam 106 contacting the surface of resist layer 104 as electron beam 106 is scanned across the surface of resist layer 104, the location of an area on the surface with a voltage potential that differs from surrounding areas may be determined. Consequently, the location of registration mark 102 underlying resist layer 104 may be determined with electron beam 106 without penetrating resist layer 104.

Detector 110, which conventionally detects the secondary electron signal, moves in conjunction with electron beam source 107 across the surface of resist layer 104. Detector 110 is sensitive to changes in the secondary electron signal indicating a contrast in the electrical charge on the surface of resist layer 104.

Because electron beam 106 does not have to penetrate resist layer 104 in order to detect the registration mark, a low energy electron beam may be used. Thus, an electron beam microcolumn or other source of low energy electron beams may be used to generate the secondary electron signal used to detect registration mark 102. Moreover, during a direct electron beam writing lithography process the same electron beam 106 that is used to write on the surface of resist layer 104 may be used to generate the secondary electron signal that is used to detect the location of registration mark 102. Of course, detection of registration mark 102 by a low energy electron beam is not limited to electron beam lithography. If desired an electron beam may detect registration mark 102 at other steps in the processing of substrate 100. Thus, by providing an AC voltage on registration mark 102, a voltage potential is generated on the surface of resist layer 104 that advantageously permits a one to one correspondence between the viewing beam and the writing beam.

Figure 3:
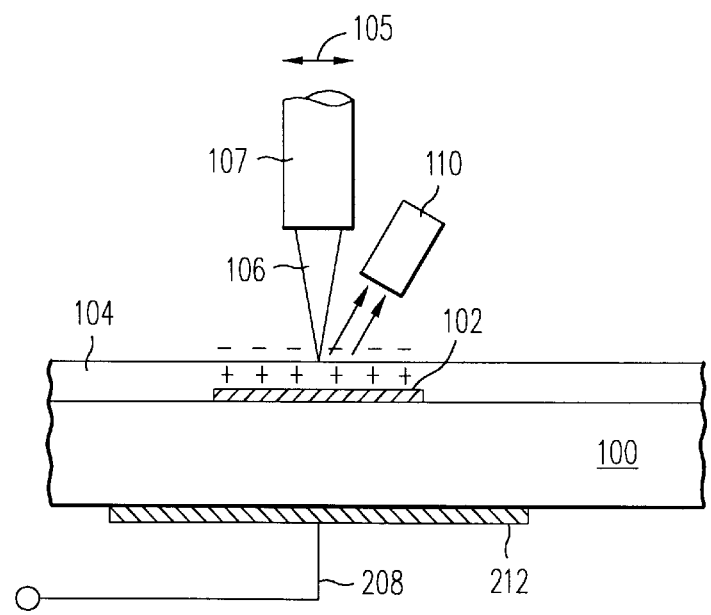
FIG. 3 is a side view of a semiconductor substrate with a registration mark that is capacitively coupled to a conductive plate on the bottom of the semiconductor substrate and the registration mark is capacitively inducing a voltage potential on the surface of the layer of resist, where an electron beam is detecting the registration mark using secondary electrons.

FIG. 3 shows semiconductor substrate 100 with registration mark 102 underlying resist layer 104. The structure shown in FIG. 3 is similar to the structure shown in FIG. 2, like designated elements being the same. However, in FIG. 3, registration mark 102 is capacitively coupled to the voltage source by a conductive plate 212 instead of being directly connected to electrical lead 108 (shown in FIG. 2).

Conductive plate 212 may be placed on the bottom side of substrate 100. Conductive plate 212, which may be any metal such as aluminum that is suitable for use in a vacuum, covers the entire bottom surface of substrate 100 or may cover an area that is slightly larger than registration mark 102 and that is directly under registration mark.

Taking advantage of the insulation properties of semiconductor substrate 100, which is e.g. silicon, conductive plate 212 is capacitively coupled to registration mark 102. Thus, when conductive plate 212 receives an AC voltage via electrical lead 208, a charge is generated on registration mark 102, as shown by the "+" signs in FIG. 3, which in turn generates a charge on the surface of resist layer 104, as shown by the "−" signs in FIG. 3. Thus, as described above, the secondary electron signal generated from electron beam 106 can be used to detect registration mark 102 under resist layer 104.

Because conductive plate 212 is capacitively coupled to registration mark 102, electric lead 108 shown in FIG. 2 is not necessary. Thus, the processing of substrate 100 is simplified. Further, without the need to connect all the registration marks on substrate 100 with electric leads, a greater area of substrate 100 may be used for devices.

Although the present invention has been described in considerable detail with reference to certain versions thereof, other versions are possible. For example, the detection of registration marks by capacitive coupling the registration mark to the surface of the resist layer is not limited to a low energy electron beam. Secondary electron signals from a high energy electron (or other charged particle) beam may also be used to precisely locate a registration mark using an embodiment of the present invention. Further, the process steps to apply registration mark 102 and either electric lead 108 or capacitive plate 212 is not limited to those steps described herein. Registration mark 102 may be applied to any layer on substrate 100 at any desired step in the processing. Further, the present invention does not demand that registration mark 102 be covered specifically with resist layer 104, but that registration mark 102 is simply covered with a layer that has insulator properties. Therefore, the spirit and scope of the appended claims should not be limited to the description of the versions depicted in the figures.

What is claimed is:

1. A structure comprising:

a semiconductor substrate having a principal surface;

a conductive registration mark on said principal surface of said semiconductor substrate;

at least one layer applied over said conductive registration mark, said at least one layer having a top surface; and a structure on said substrate which couples a voltage to said conductive registration mark, whereby said conductive registration mark is capacitively coupled to said top surface of said at least one layer.

2. The structure of claim 1, further comprising at least one layer disposed between said semiconductor substrate and said conductive registration mark.

3. The structure of claim 1, wherein said structure comprises an electrical lead directly connected to said conductive registration mark, said electrical lead providing said voltage to said conductive registration mark.

4. The structure of claim 1, wherein said structure further comprises a conductive plate on an opposing surface of said semiconductor substrate, said conductive plate being capacitively coupled with said conductive registration mark.

5. The structure of claim 1, wherein the location of said conductive registration mark on said semiconductor substrate is determined by the capacitive coupling between said conductive registration mark and said top surface of said at least one layer.

6. The structure of claim 1, further comprising a plurality of conductive registration marks, wherein said structure on said substrate couples said voltage to said plurality of registration marks, whereby said plurality of said conductive registration marks are capacitively coupled to said top surface of said at least one layer.

* * * * *